(12) United States Patent
Aoki et al.

(10) Patent No.: US 11,594,398 B2
(45) Date of Patent: *Feb. 28, 2023

(54) APPARATUS AND METHOD FOR PLASMA PROCESSING

(71) Applicant: TOKYO ELECTRON LIMITED, Tokyo (JP)

(72) Inventors: Yusuke Aoki, Miyagi (JP); Fumiya Takata, Miyagi (JP); Toshikatsu Tobana, Miyagi (JP); Shinya Morikita, Miyagi (JP); Kazunobu Fujiwara, Miyagi (JP); Jun Abe, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 469 days.

This patent is subject to a terminal disclaimer.

(21) Appl. No.: 16/790,028

(22) Filed: Feb. 13, 2020

(65) Prior Publication Data

US 2020/0266036 A1    Aug. 20, 2020

(30) Foreign Application Priority Data

Feb. 14, 2019   (JP) .............................. JP2019-024282

(51) Int. Cl.
  *C23C 16/00*   (2006.01)
  *H01L 21/306*  (2006.01)
  *H01J 37/32*   (2006.01)
  *B08B 5/00*    (2006.01)

(52) U.S. Cl.
  CPC .......... *H01J 37/32174* (2013.01); *B08B 5/00* (2013.01); *H01J 37/32146* (2013.01); *H01J 37/32568* (2013.01); *H01J 37/32715* (2013.01); *H01J 2237/335* (2013.01)

(58) Field of Classification Search
  CPC ........... H01J 37/32146; H01J 37/32174; H01J 37/32568; H01J 37/32715; H01J 2237/335; B08B 5/00; H01L 21/02041; H01L 21/02252; H01L 21/02274;
  (Continued)

(56) References Cited

U.S. PATENT DOCUMENTS 11,251,048 B2 *  2/2022  Aoki ................... H01J 37/3244
2009/0029067 A1 * 1/2009  Sciamanna ............. C23C 16/26
                                                          427/577

(Continued)

FOREIGN PATENT DOCUMENTS

JP       2006-270019 A    10/2006

*Primary Examiner* — Luz L Alejandro Mulero
(74) *Attorney, Agent, or Firm* — Weihrouch IP

(57) ABSTRACT

An apparatus for plasma processing is configured to generate plasma in a chamber and periodically apply a pulsed negative DC voltage to an upper electrode from a DC power supply in the plasma processing on a substrate and in plasma cleaning. A duty ratio of the pulsed negative DC voltage used for the plasma processing is smaller than a duty ratio of the pulsed negative DC voltage used for the plasma cleaning. An absolute value of an average value of an output voltage of the DC power supply used for the plasma processing is smaller than an absolute value of an average value of the output voltage of the DC power supply used for the plasma cleaning.

12 Claims, 8 Drawing Sheets

(58) Field of Classification Search
CPC ......... H01L 21/02318; H01L 21/02334; H01L 21/02664; H01L 21/02661
See application file for complete search history.

(56) References Cited

U.S. PATENT DOCUMENTS

| | | | | |
|---|---|---|---|---|
| 2010/0248488 | A1* | 9/2010 | Agarwal | H01J 37/32706 |
| | | | | 438/714 |
| 2012/0241412 | A1* | 9/2012 | Murakami | H01J 37/32862 |
| | | | | 156/345.24 |
| 2014/0326409 | A1* | 11/2014 | Koshiishi | H01J 37/32541 |
| | | | | 156/345.29 |
| 2017/0345666 | A1* | 11/2017 | Morikita | H01L 21/0273 |
| 2017/0365450 | A1* | 12/2017 | Bi | H01J 37/32862 |

* cited by examiner

APPARATUS AND METHOD FOR PLASMA PROCESSING

CROSS-REFERENCE TO RELATED APPLICATIONS

This application claims priority to Japanese Patent Application No. 2019-024282, filed on Feb. 14, 2019, the entire contents of which are incorporated herein by reference.

TECHNICAL FIELD

The present disclosure relates to an apparatus and method for plasma processing.

BACKGROUND

In manufacturing electronic devices, a plasma processing apparatus is used. An example of a plasma processing apparatus is a capacitively coupled plasma processing apparatus. The capacitively coupled plasma processing apparatus includes a chamber, an upper electrode, and a lower electrode. The lower electrode forms a part of a mounting table and is disposed in the chamber. The upper electrode is disposed above the lower electrode. In the capacitively coupled plasma processing apparatus, a gas in the chamber is excited by supplying a radio frequency power to the upper electrode or the lower electrode, and plasma is generated. A substrate on the mounting table is processed by chemical species from the generated plasma.

The capacitively coupled plasma processing apparatus may include a DC power supply and may be configured to apply a negative DC voltage from the DC power supply to the upper electrode during the plasma generation in the chamber. A plasma processing apparatus including such a DC power supply is disclosed in Japanese Patent Application Publication No. 2006-270019.

During plasma processing for the substrate, it is required to suppress damage to an inner wall surface of the chamber and to efficiently remove deposits adhered to the inner wall surface by plasma cleaning.

SUMMARY

In accordance with an aspect of the present disclosure, there is provided an apparatus for plasma processing, including: a chamber; a substrate support including a lower electrode disposed in the chamber; an upper electrode disposed above the substrate support; an RF power supply configured to generate plasma in the chamber; a DC power supply electrically connected to the upper electrode; and a controller configured to control the RF power supply and the DC power supply. The chamber is grounded. The DC power supply is configured to periodically generate a pulsed negative DC voltage, and an output voltage of the DC power supply is a negative DC voltage in a first period of a cycle and is 0V in a remaining second period of the cycle to periodically output the pulsed negative DC voltage. The controller is configured to perform a first control in which the RF power supply supplies an RF power and the DC power supply periodically applies the pulsed negative DC voltage to the upper electrode to generate plasma in the chamber and perform the plasma processing on a substrate mounted on the substrate support, perform a second control in which the RF power supply supplies an RF power and the DC power supply periodically applies the pulsed negative DC voltage to the upper electrode to generate plasma in the chamber and perform plasma cleaning on an inner wall surface of the chamber, set a first duty ratio used for the first control to be smaller than a second duty ratio used for the second control, each of the first duty ratio and the second duty ratio being a ratio of the first period to the cycle, and set an absolute value of an average value of the output voltage of the DC power supply in the cycle in the first control to be smaller than an absolute value of an average value of the output voltage of the DC power supply in the cycle in the second control.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
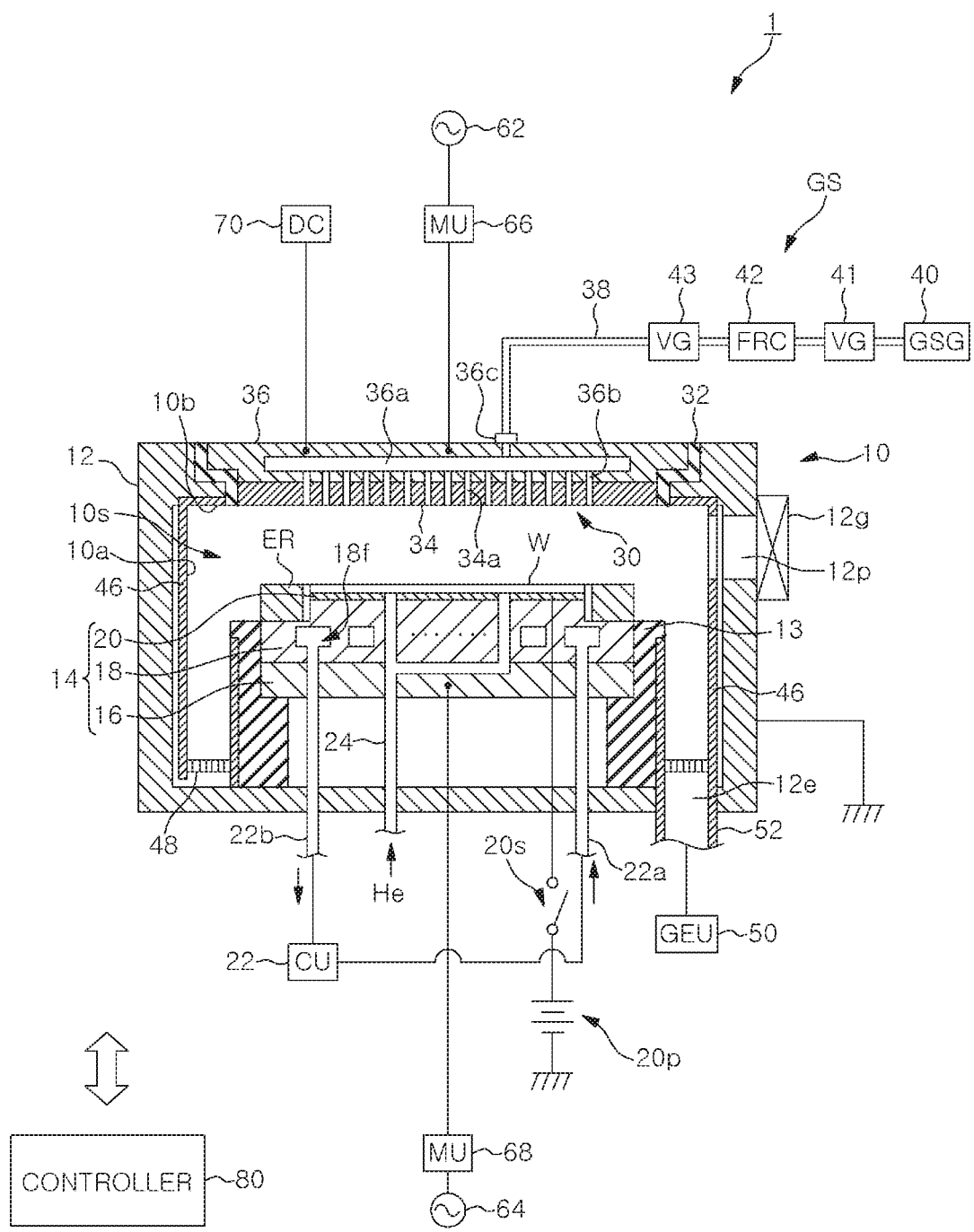
FIG. 1 schematically shows a plasma processing apparatus according to an embodiment.

Hereinafter, various embodiments will be described.

In one embodiment, there is provided an apparatus for plasma processing. The apparatus includes a chamber, a substrate support, an upper electrode, an RF power supply, a DC power supply and a controller. The substrate support includes a lower electrode disposed in the chamber. The upper electrode is disposed above the substrate support. The RF power supply is configured to generate plasma in the chamber. The DC power supply is electrically connected to the upper electrode. The controller is configured to control the RF power supply and the DC power supply. The chamber is grounded. The DC power supply is configured to periodically generate a pulsed negative DC voltage. In order to periodically output the pulsed negative DC voltage, an output voltage of the DC power supply is a negative DC voltage in a first period of a cycle and is 0V in a remaining second period of the cycle. The controller is configured to perform a first control and a second control. The first control is executed to generate plasma in the chamber and perform the plasma processing on a substrate mounted on the substrate support. In the first control, the controller controls the RF power supply to supply an RF power and controls the DC power supply to periodically apply the pulsed negative DC voltage to the upper electrode. The second control is executed to generate plasma in the chamber and perform plasma cleaning on an inner wall surface of the chamber. In the second control, the controller controls the RF power supply to supply an RF power and controls the DC power supply to periodically apply the pulsed negative DC voltage to the upper electrode. The controller sets a duty ratio (first duty ratio) used in the first control to be smaller than a duty ratio (second duty ratio) used in the second control. The duty ratio is a ratio of the first period to the cycle. Further, the controller sets an absolute value of an average value of the output voltage of the DC power supply in the cycle in the first control to be smaller than an absolute value of an average value of the output voltage of the DC power supply in the cycle in the second control.

The bias (potential) generated on the inner wall surface of the chamber is increased as each of the duty ratio of the pulsed negative DC voltage, the absolute value of the pulsed negative DC voltage, and the absolute value of the average value (the average voltage) of the output voltage of the DC power supply in the cycle is increased. In accordance with the plasma processing apparatus of the above embodiment, the duty ratio and the absolute value of the average voltage in the first control are set to relatively small values and, thus, the bias generated on the inner wall surface of the chamber becomes relatively small. Accordingly, the damage to the inner wall surface of the chamber during the plasma processing on the substrate can be suppressed. Further, the duty ratio and the absolute value of the average voltage in the second control are set to relatively large values and, thus, the bias generated on the inner wall surface of the chamber becomes relatively large. Accordingly, the deposits formed on the inner wall surface of the chamber can be efficiently removed by the plasma cleaning.

In one embodiment, a frequency that is a reciprocal of the cycle may be 400 kHz or more. Further, the frequency may be 1 MHz or less.

In one embodiment, each of the first duty ratio and the second duty ratio may be 20% or more and 50% or less.

In another embodiment, there is provided a method of plasma processing performed by a plasma processing apparatus. The plasma processing apparatus includes a chamber, a substrate support, an upper electrode, an RF power supply and a DC power supply. The substrate support includes a lower electrode disposed in the chamber. The upper electrode is disposed above the substrate support. The RF power supply is configured to generate plasma in the chamber. The DC power supply is electrically connected to the upper electrode. The chamber is grounded. The DC power supply is configured to periodically generate a pulsed negative DC voltage. In order to periodically output the pulsed negative DC voltage, an output voltage of the DC power supply is a negative DC voltage in a first period of a cycle and is 0V in a remaining second period of the cycle. The method includes a step of performing the plasma processing on a substrate mounted on the substrate support. The method includes a step of performing plasma cleaning on an inner wall surface of the chamber. In the step of performing the plasma processing, the RF power supply supplies an RF power and the DC power supply periodically applies the pulsed negative DC voltage to the upper electrode to generate plasma in the chamber. In the step of performing the plasma cleaning, the RF power supply supplies an RF power and the DC power supply periodically applies the pulsed negative DC voltage to the upper electrode to generate plasma in the chamber. A first duty ratio used in the step of performing the plasma processing is smaller than a second duty ratio used in the step of performing the plasma cleaning. Each of the first duty ratio and the second duty ratio is a ratio of the first period to the cycle. An absolute value of an average value of the output voltage of the DC power supply in the cycle in the step of performing the plasma processing is smaller than an absolute value of an average value of the output voltage of the DC power supply in the cycle in the step of performing the plasma cleaning.

Hereinafter, various embodiments will be described in detail with reference to the accompanying drawings. Like reference numerals will be given to like or corresponding parts throughout the drawings.

FIG. 1 schematically shows a plasma processing apparatus according to an embodiment. A plasma processing apparatus 1 shown in FIG. 1 is a capacitively coupled plasma processing apparatus. The plasma processing apparatus 1 includes a chamber 10. The chamber 10 has therein an inner space 10s.

The chamber 10 includes a chamber body 12. The chamber body 12 has a substantially cylindrical shape. The inner space 10s is disposed in the chamber body 12. The chamber body 12 is made of a conductor such as aluminum. The chamber body 12 is grounded. A corrosion resistant film is coated on an inner wall surface of the chamber body 12. The corrosion resistant film may be, e.g., a ceramic film made of aluminum oxide or yttrium oxide.

A passage 12p is formed through a sidewall of the chamber body 12. The substrate W is transferred between the inner space 10s and the outside of the chamber 10 through the passage 12p. The passage 12p can be opened and closed by a gate valve 12g. The gate valve 12g is disposed along the sidewall of the chamber body 12.

A supporting part 13 is disposed at the bottom portion of the chamber body 12. The supporting part 13 is made of an insulating material. The supporting part 13 has a substantially cylindrical shape. The supporting part 13 extends upward from the bottom portion of the chamber body 12 in the inner space 10s. The support part 13 supports a substrate support 14. The substrate support 14 is configured to support the substrate W in the chamber 10, i.e., in the inner space 10s.

The substrate support 14 includes a lower electrode 18 and an electrostatic chuck 20. The lower electrode 18 and the electrostatic chuck 20 are disposed in the chamber 10. The substrate support 14 may further include an electrode plate 16. The electrode plate 16 is made of a conductor such as aluminum and has a substantially disc shape. The lower electrode 18 is disposed on the electrode plate 16. The lower electrode 18 is made of a conductor such as aluminum and has a substantially disc shape. The lower electrode 18 is electrically connected to the electrode plate 16.

The electrostatic chuck 20 is disposed on the lower electrode 18. A substrate W is mounted on the upper surface of the electrostatic chuck 20. The electrostatic chuck 20 has a main body and an electrode. The main body of the electrostatic chuck 20 is made of a dielectric material. The electrode of the electrostatic chuck 20 has a film shape and is disposed in the main body of the electrostatic chuck 20. The electrode of the electrostatic chuck 20 is connected to a DC power supply 20p through a switch 20s. When a voltage is applied from the DC power supply 20p to the electrode of the electrostatic chuck 20, an electrostatic attractive force is generated between the electrostatic chuck 20 and the substrate W. Due to the generated electrostatic attractive force, the substrate W is attracted to and held by the electrostatic chuck 20.

An edge ring ER is disposed on the substrate support 14. The edge ring ER may be made of, but is not limited to, silicon, silicon carbide, or quartz. When the substrate W is processed in the chamber 10, the substrate W is disposed on the electrostatic chuck 20 and in a region surrounded by the edge ring ER.

A flow path 18f is formed in the lower electrode 18. A heat exchange medium (e.g., coolant) is supplied from a chiller unit (CU) 22 to the flow path 18f through a line 22a. The chiller unit 22 is disposed outside the chamber 10. The heat exchange medium supplied to the flow path 18f is returned to the chiller unit 22 through a line 22b. In the plasma processing apparatus 1, a temperature of the substrate W mounted on the electrostatic chuck 20 is controlled by heat exchange between the heat exchange medium and the lower electrode 18.

The plasma processing apparatus 1 may further include a gas supply line 24. The gas supply line 24 is configured to supply a heat transfer gas (e.g., He gas) to a gap between the upper surface of the electrostatic chuck 20 and the backside of the substrate W. The heat transfer gas is supplied from a heat transfer gas supply mechanism to the gas supply line 24.

The plasma processing apparatus 1 further includes an upper electrode 30. The upper electrode 30 is disposed above the substrate support 14. The upper electrode 30 is supported at the upper portion of the chamber body 12 through a member 32. The member 32 is made of an insulating material. The upper electrode 30 and the member 32 block an upper opening of the chamber body 12.

The upper electrode 30 may include a ceiling plate 34 and a holder 36. The bottom surface of the ceiling plate 34 faces the inner space 10s and defines the inner space 10s. The ceiling plate 34 is made of a silicon-containing material. For example, the ceiling plate 34 is made of silicon or silicon carbide. A plurality of gas injection holes 34a is formed in the ceiling plate 34. The gas injection holes 34a are formed through the ceiling plate 34 in a thickness direction of the ceiling plate 34.

The holder 36 detachably holds the ceiling plate 34. The holder 36 is made of a conductive material such as aluminum. A gas diffusion space 36a is formed inside the holder 36. A plurality of gas holes 36b is formed in the holder 36. The gas holes 36b extend downward from the gas diffusion space 36a. The gas holes 36b communicate with the respective gas injection holes 34a. A gas inlet port 36c is formed in the holder 36. The gas inlet port 36c is connected to the gas diffusion space 36a. A gas supply line 38 is connected to the gas inlet port 36c.

A gas source group (GSG) 40 is connected to the gas supply line 38 through a valve group (VG) 41, a flow rate controller group (FRC) 42, and a valve group (VG) 43. The gas source group 40, the valve group 41, the flow rate controller group 42, and the valve group 43 constitute a gas supply unit GS. The gas source group 40 includes a plurality of gas sources. Each of the valve group 41 and the valve group 43 includes a plurality of on-off valves. The flow rate controller group 42 includes a plurality of flow rate controllers. Each of the flow rate controllers of the flow controller group 42 is a mass flow controller or a pressure control type flow controller. Each of the gas sources of the gas source group 40 is connected to the gas supply line 38 through the corresponding on/off valve of the valve group 41, the corresponding flow controller of the flow rate controller group 42, and the corresponding on/off valve of the valve group 43.

In the plasma processing apparatus 1, a shield 46 is detachably disposed along the inner wall surface of the chamber body 12. The shield 46 is also disposed on the outer periphery of the supporting part 13. The shield 46 prevents by-products of the plasma processing from being adhered to the chamber body 12. The shield 46 is obtained by forming a corrosion resistant film on a surface of an aluminum base, for example. The corrosion resistant film may be a ceramic film made of yttrium oxide. In one embodiment, the shield 46 provides a sidewall surface 10a and an upper wall surface 10b among the inner wall surfaces of the chamber 10. The inner wall surfaces of the chamber 10 that include the sidewall surface 10a and the upper wall surface 10b define the inner space 10s. The sidewall surface 10a and the upper wall surface 10b may be provided by one or more members, e.g., the chamber body 12, other than the shield 46.

A baffle plate 48 is disposed between the supporting part 13 and the sidewall of the chamber body 12. The baffle plate 48 is obtained by forming a corrosion resistant film on a surface of an aluminum base, for example. The corrosion resistant film may be a ceramic film made of yttrium oxide. The baffle plate 48 has a plurality of through-holes. At the bottom portion of the chamber body 12, a gas exhaust port 12e is disposed below the baffle plate 48. A gas exhaust unit (GEU) 50 is connected to the gas exhaust port 12e through a gas exhaust line 52. The gas exhaust unit 50 includes a pressure control valve, and a vacuum pump such as a turbo molecular pump.

The plasma processing apparatus 1 further includes a first RF power supply 62 and a second RF power supply 64. The first RF power supply 62 generates a first RF power. In one example, the first RF power has a frequency suitable for plasma generation. The frequency of the first RF power is within a range of, e.g., 27 MHz to 100 MHz. The first RF power supply 62 is connected to the upper electrode 30 through a matching unit (MU) 66. The matching unit 66 has a circuit for matching an output impedance of the first RF power supply 62 and an impedance of a load side (the upper electrode 30 side). The first RF power supply 62 may be connected to the lower electrode 18 through the matching unit 66 and the electrode plate 16.

The second RF power supply 64 generates a second RF power. The second RF power has a frequency lower than the frequency of the first RF power. The second RF power is used as a bias RF power for attracting ions to the substrate W. The frequency of the second RF power is within a range of, e.g., 400 kHz to 40 MHz. The second RF power supply 64 is connected to the lower electrode 18 through a matching unit (MU) 68 and the electrode plate 16. The matching unit 68 has a circuit for matching an output impedance of the second RF power supply 64 and the impedance of the load side (the lower electrode 18 side).

Figure 2:
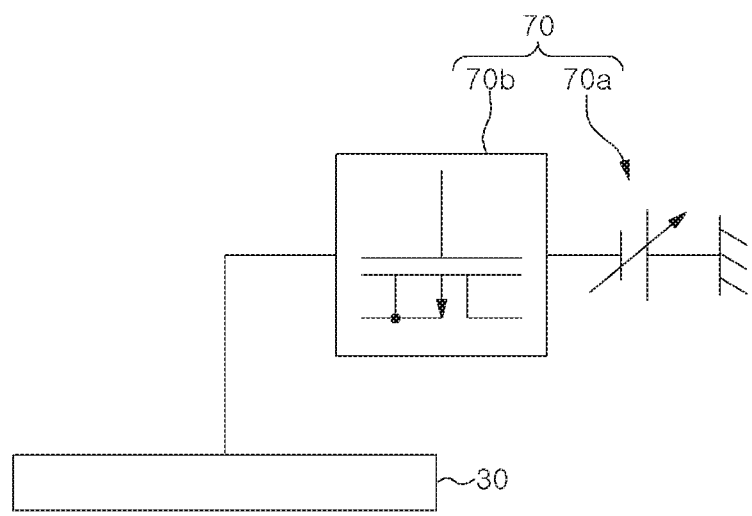
FIG. 2 shows an example of a configuration of a DC power supply of the plasma processing apparatus shown in FIG. 1.
Figure 3:
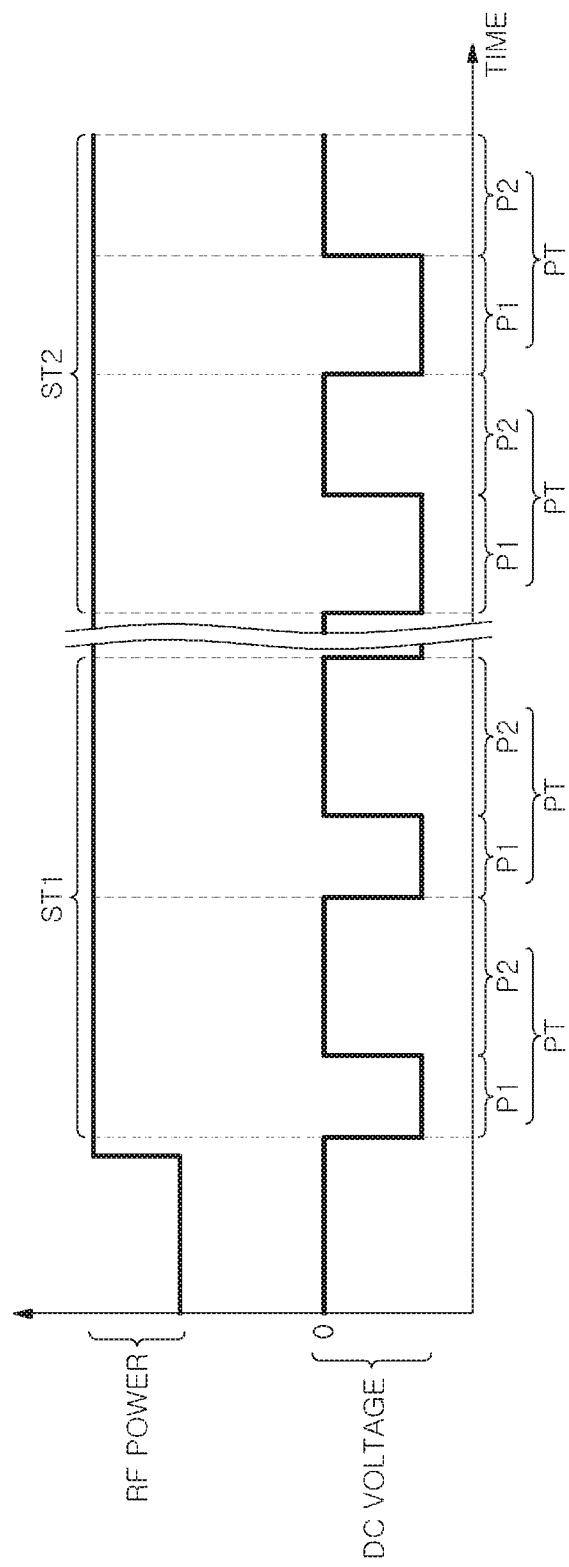
FIG. 3 is a timing chart of a plasma processing method that is performed by the plasma processing apparatus according to the embodiment.

The plasma processing apparatus 1 further includes a DC power supply (DC) 70. The DC power supply 70 is electrically connected to the upper electrode 30. The DC power supply 70 is configured to periodically generate a pulsed negative DC voltage. FIG. 2 shows an example of the configuration of the DC power supply of the plasma processing apparatus shown in FIG. 1. FIG. 3 is a timing chart of a plasma processing method that is performed by the plasma processing apparatus according to the embodiment. In FIG. 3, the horizontal axis represents time and the vertical axis represents the supply of the RF power (first RF power and/or second RF power) and the DC voltage that is the output voltage of the DC power supply 70. In FIG. 3, a high level of the RF power indicates that the RF power is being supplied, and a low level of the RF power indicates that the RF power is not supplied. Hereinafter, FIGS. 2 and 3 will be referred to together with FIG. 1.

In one embodiment, the DC power supply 70 includes a variable DC power source 70a and a switching device 70b.

The variable DC power source 70a is configured to generate a negative DC voltage continuously. The level of the negative DC voltage outputted from the variable DC power source 70a can be controlled by a controller 80 to be described later. The switching device 70b switches connection and disconnection between the variable DC power source 70a and the upper electrode 30 by switching an ON/OFF state thereof. The switching of the ON/OFF state of the switching device 70b may be controlled by the controller 80.

In order to periodically output the pulsed negative DC voltage, the DC power supply 70 outputs a negative DC voltage in a first period P1 of a cycle PT. In one embodiment, in the first period P1 of the cycle PT, the switching device 70b is switched to the ON state to connect the variable DC power source 70a with the upper electrode 30. The DC power supply 70 outputs 0V in the remaining second period P2 of the cycle PT. In one embodiment, in the second period P2 of the cycle PT, the switching device 70b is switched to the OFF state to cut off the connection between the variable DC power source 70a and the upper electrode 30.

In one embodiment, the frequency f that is the reciprocal of the cycle PT (or the cycle time of each of the cycles PT) may be 400 kHz or more. In one embodiment, the frequency f may be 1 MHz or less. When the frequency f is 1 MHz or less, the independent controllability of the behavior of ions with respect to the generation of radicals in the chamber 10 is enhanced. In one embodiment, the ratio of the first period P1 in each of the cycles PT (i.e., the duty ratio of the pulsed negative DC voltage) may be 20% or more and 50% or less.

The plasma processing apparatus 1 further includes the controller 80. The controller 80 may be a computer including a processor, a storage unit such as a memory, an input device, a display device, a signal input/output interface, and the like. The controller 80 controls the respective components of the plasma processing apparatus 1. The controller 80 allows an operator to input a command or the like using the input device to manage the plasma processing apparatus 1. Further, the controller 80 allows the display device to visualize and display an operation status of the plasma processing apparatus 1. A control program and recipe data are stored in the storage unit of the controller 80. The control program is executed by the processor of the controller 80 to execute various processes in the plasma processing apparatus 1. The processor of the controller 80 executes the control program and controls the respective components of the plasma processing apparatus 1 based on the recipe data. Accordingly, a plasma processing method according to an embodiment that will be described below is performed by the plasma processing apparatus 1.

Figure 4:
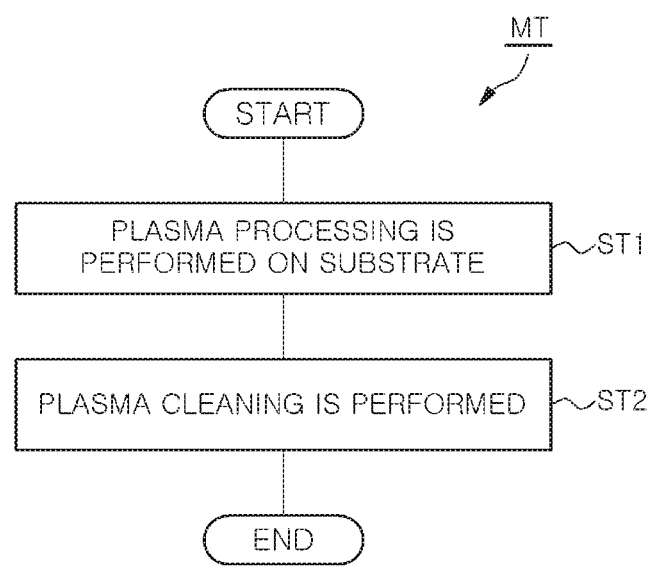
FIG. 4 is a flowchart of the plasma processing method according to the embodiment.

Hereinafter, a plasma processing method according to an embodiment will be described with reference to FIGS. 3 and 4. FIG. 4 is a flowchart of a plasma processing method according to the embodiment. Hereinafter, an example in which the plasma processing method shown in FIG. 4 (hereinafter, referred to as "method MT") is performed by the plasma processing apparatus 1 will be described. In addition, the control of the respective components of the plasma processing apparatus 1 by the controller 80 will be described.

The method MT includes steps ST1 and ST2. In step ST1, plasma processing is performed on the substrate. During the execution of step ST1, the substrate W is held by the electrostatic chuck 2 in the chamber 10. In step ST1, a processing gas is supplied into the chamber 10. The processing gas contains chemical species selected for processing of the substrate W. In step ST1, the first RF power and/or the second RF power is supplied to generate plasma of the processing gas in the chamber 10. In step ST1, a pulsed negative DC voltage is periodically applied to the upper electrode 30. In step ST1, a first duty ratio is set as the duty ratio that is the ratio of the first period P1 to the cycle PT. In step ST1, a first average voltage is set as the average value (i.e., average voltage) of the output voltage of DC power supply 70. The average voltage is the average value of the output voltage of the DC power supply 70 in the cycle PT, and can be expressed by a product of a pulsed negative DC voltage and the decimal form of the duty ratio.

The controller 80 performs a first control to execute step ST1. In the first control, the controller 80 controls the respective components of the plasma processing apparatus 1 as follows. The controller 80 controls the gas supply unit GS to supply the processing gas into the chamber 10. The controller 80 controls the gas exhaust unit 50 to set a pressure in the chamber 10 to a specified pressure. The controller 80 controls the first RF power supply 62 and/or the second RF power supply 64 to supply the first RF power and/or the second RF power. The controller 80 controls the DC power supply 70 to periodically apply a pulsed negative DC voltage to the upper electrode 30. The controller 80 sets the duty ratio of the pulsed negative DC voltage during the execution of step ST1 to the first duty ratio, and sets the average value of the output voltage of the DC power supply 70 in the cycle PT during the execution of step ST1 to the first average voltage.

In step ST2, plasma cleaning of the inner wall surface of the chamber 10 is performed. During the execution of step ST2, no object may be mounted on the electrostatic chuck 20. Alternatively, a dummy substrate may be mounted on the electrostatic chuck 20 during the execution of step ST2. In step ST2, a cleaning gas is supplied into the chamber 10. The cleaning gas contains chemical species for removing deposits adhered to the inner wall surface of the chamber 10. The deposits to be removed may be generated in step ST1 or in a different step. The cleaning gas may be the same as or different from the processing gas used in step ST1. In step ST2, the first RF power and/or the second RF power is supplied to generate plasma of the processing gas in the chamber 10. In step ST2, a pulsed negative DC voltage is periodically applied to the upper electrode 30. In step ST2, a second duty ratio is set as the duty ratio that is the ratio of the first period P1 in the cycle PT. In step ST2, a second average voltage is set as the average value (i.e., average voltage) of the output voltage of DC power supply 70.

The controller 80 performs a second control to execute step ST2. In the second control, the controller 80 controls the respective components of the plasma processing apparatus 1 as follows. The controller 80 controls the gas supply unit GS to supply the cleaning gas into the chamber 10. The controller 80 controls the gas exhaust unit 50 to set the pressure in the chamber 10 to a specified pressure. The controller 80 controls the first RF power supply 62 and/or the second RF power supply 64 to supply the first RF power and/or the second RF power. The controller 80 controls the DC power supply 70 to periodically apply a pulsed negative DC voltage to the upper electrode 30. The controller 80 sets the duty ratio of the pulsed negative DC voltage during the execution of step ST2 to the second duty ratio, and sets the average value of the output voltage of the DC power supply 70 in the cycle PT during the execution of step ST2 to the second average voltage.

The first duty ratio used in step ST1 is set to be smaller than the second duty ratio used in step ST2. The first duty ratio may be, e.g., 30% or less. The level of the pulsed negative DC voltage used in step ST1 is set depending on the plasma processing to be performed on the substrate W. Here, the absolute value of the first average voltage used in step ST1 is set to be smaller than the absolute value of the second average voltage used in step ST2.

In the first period P1, due to the pulsed negative DC voltage applied to the upper electrode 30 (cathode), the electrical neutrality in the plasma is locally lost at the cathode side (the upper electrode 30 side) and the anode side (the chamber 10). In the second period P2, a bias (potential) is generated in the chamber 10 to ensure the electrical neutrality of the plasma. Due to the bias (potential), ions are attracted to the inner wall surface of the chamber 10. The bias generated on the inner wall surface of the chamber 10 is increased as each of the duty ratio of the pulsed negative DC voltage, the absolute value of the pulsed negative DC voltage, and the absolute value of the average value (i.e., average voltage) of the output voltage of the DC power supply in the cycle PT is increased. In accordance with the plasma processing apparatus 1 and the method MT, the first duty ratio and the absolute value of the first average voltage are set to relatively small values during the plasma processing for the substrate W and, thus, the bias generated on the inner wall surface of the chamber 10 becomes relatively small. Therefore, the damage to the inner wall surface of the chamber 10 during the plasma processing for the substrate W can be suppressed. Further, during the plasma cleaning, the second duty ratio and the absolute value of the second average voltage are set to relatively large values and, thus, the bias generated on the inner wall surface of the chamber 10 becomes relatively large. Therefore, the deposits adhered to the inner wall surface of the chamber 10 can be efficiently removed by plasma cleaning.

While various embodiments have been described, various omissions, substitutions and changes can be made without being limited to the above-described embodiments. Further, other embodiments can be achieved by combining different embodiments.

For example, in the method MT, step ST2 may be executed prior to step ST1, or step ST1 and step ST2 may be alternately repeated. Alternatively, in the method MT including step ST1, step ST2 may be executed at an appropriate timing in which the cleaning of the inner wall surface of the chamber 10 is required.

Hereinafter, tests that have been performed to evaluate the plasma processing apparatus 1 and the method MT will be described. However, the present disclosure is not limited by the following tests.

(First Test)

In the first test, plasma was generated under the following conditions by the plasma processing apparatus 1 in which a first chip and a second chip made of silicon oxide were attached to the upper wall surface 10b and the sidewall surface 10a, respectively. In the first test, a plurality of levels of the pulsed negative DC voltage were used and a plurality of duty ratios of the pulsed negative DC voltage were used.

<Conditions for the First Test>

Pressure in the chamber 10: 100 mTorr (1.333 Pa)
$CF_4$ gas: 10 sccm
Ar gas: 990 sccm
First RF power: 60 MHz, 200 W
Second RF power: 40 MHz, 200 W
Frequency f of pulsed negative DC voltage: 400 kHz In contrast, in the comparative test, a negative DC voltage was continuously applied to the upper electrode 30, instead of a pulsed negative DC voltage. Other conditions in the comparative test were set to be the same as those in the first test.

Figure 5A:
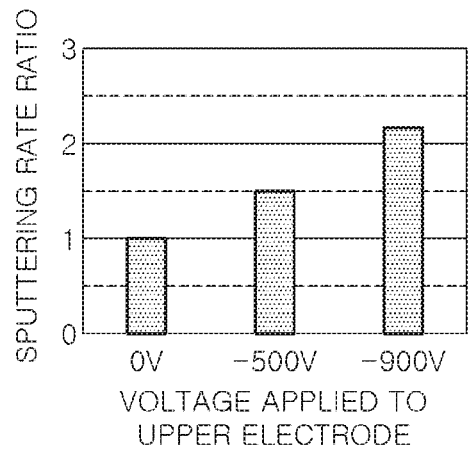
FIGS. 5A and 5B are graphs showing a sputtering rate ratio obtained in a first test.
Figure 5B:
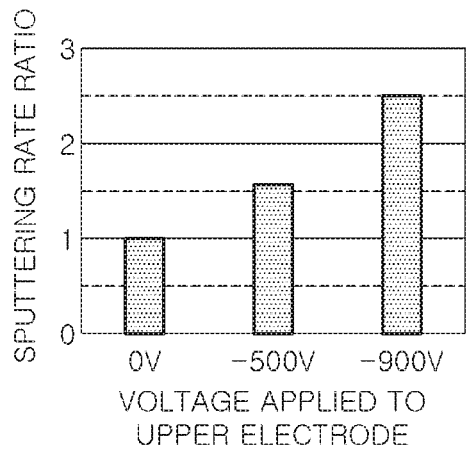
Figure 5C:
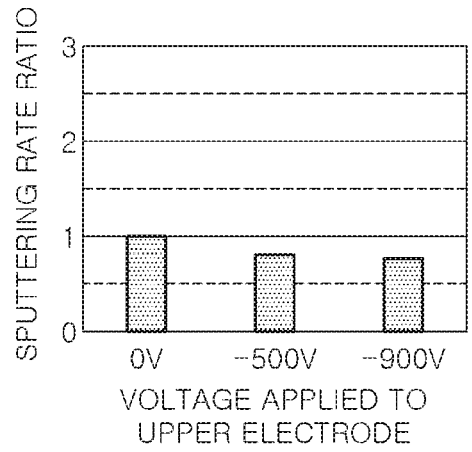
FIGS. 5C and 5D are graphs showing a sputtering rate ratio obtained in a comparative test.
Figure 5D:
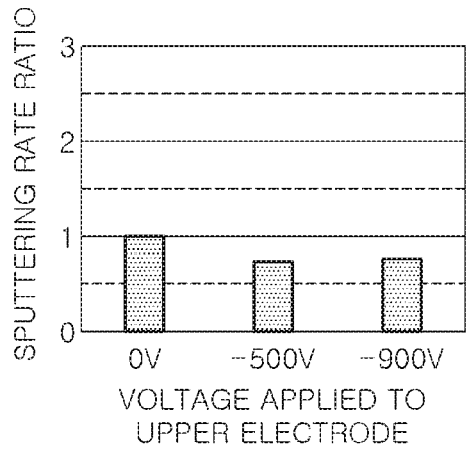
Figure 6A:
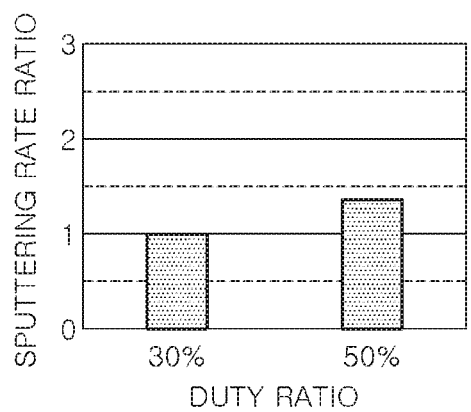
FIGS. 6A and 6B are graphs showing the sputtering rate ratio obtained in the first test.
Figure 6B:
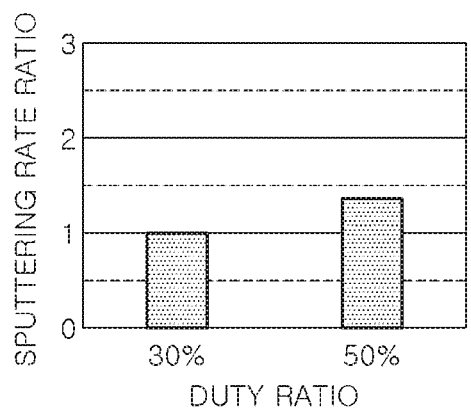
Figure 7A:
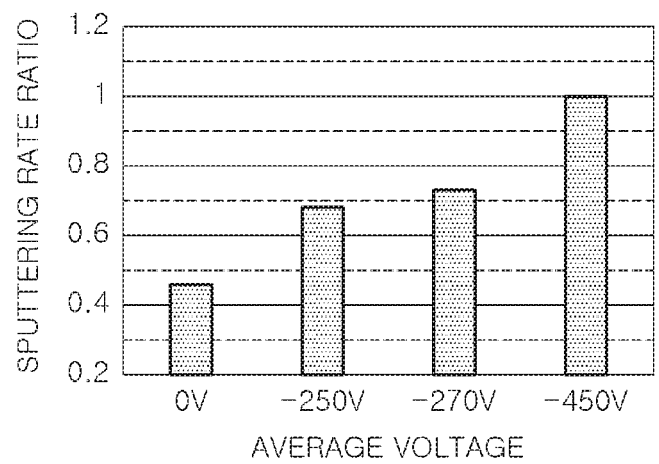
FIGS. 7A and 7B are graphs showing the sputtering rate ratio obtained in the first test.
Figure 7B:
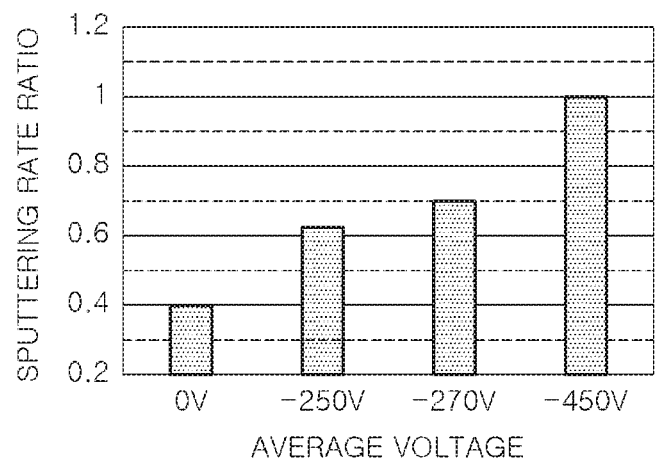

In the first test and the comparative test, an etching rate of each chip, i.e., a sputtering rate, was obtained. FIGS. 5A and 5B are graphs showing a sputtering rate ratio obtained in the first test. FIG. 5C and FIG. 5D are graphs showing a sputtering rate ratio obtained in the comparative test. In FIGS. 5A and 5B, the horizontal axis represents the level of the voltage (pulsed negative DC voltage) applied to the upper electrode and the vertical axis represents the sputtering rate ratio. In FIGS. 5C and 5D, the horizontal axis represents the level of the voltage (continuous DC voltage) applied to the upper electrode and the vertical axis represents the sputtering rate ratio. The sputtering rate ratios in FIGS. 5A to 5D are normalized by a sputtering rate at the applied voltage of 0V. FIGS. 6A and 6B are graphs showing the sputtering rate ratio obtained in the first test. In FIGS. 6A and 6B, the horizontal axis represents the duty ratio and the vertical axis represents the sputtering rate ratio. FIGS. 7A and 7B are graphs showing the sputtering rate ratio obtained in the first test. In FIGS. 7A and 7B, the horizontal axis represents the average voltage of the DC voltage applied to the upper electrode 30 and the vertical axis represents the sputtering rate ratio. The sputtering rate ratios in FIGS. 5A, 5C, 6A, and 7A are obtained from the sputtering rate of the first chip. The sputtering rate ratios in FIGS. 5B, 5D, 6B, and 7B are obtained from the sputtering rate of the second chip.

As shown in FIGS. 5C and 5D, the sputtering rate ratio was hardly changed even when the absolute value of the negative DC voltage continuously applied to the upper electrode 30 was increased. In other words, the bias generated on the inner wall surface of the chamber 10 was hardly changed even when the absolute value of the negative DC voltage continuously applied to the upper electrode 30 was increased. However, according to the result of the first test, the sputtering rate ratio was increased as the absolute value of the pulsed negative DC voltage applied to the upper electrode 30 was increased as shown in FIGS. 5A and 5B. In other words, according to the result of the first test, the bias generated on the inner wall surface of the chamber 10 was increased as the absolute value of the pulsed negative DC voltage applied to the upper electrode 30 was increased.

Further, as a result of the first test, as shown in FIGS. 6A and 6B, the sputtering rate ratio was increased as the duty ratio of the pulsed negative DC voltage applied to the upper electrode 30 was increased. In other words, according to the result of the first test, the bias generated on the inner wall surface of the chamber 10 was increased as the duty ratio of the pulsed negative DC voltage applied to the upper electrode 30 was increased. Further, according to the result of the first test, as shown in FIGS. 7A and 7B, the sputtering rate ratio was increased as the absolute value of the average voltage of the pulsed negative DC voltage applied to the upper electrode 30 was increased. In other words, according to the result of the first test, the bias generated on the inner wall surface of the chamber 10 was increased as the absolute value of the average voltage of the pulsed negative DC voltage applied to the upper electrode 30 was increased.

(Second Test)

In the second test, plasma was generated under the same conditions as those in the first test by the plasma processing apparatus 1. In the second test, the amount (i.e., thickness) of silicon-containing deposits adhered on a sample on the electrostatic chuck 20 was measured. The silicon-containing deposits are generated by silicon released from the ceiling plate 34 due to collision of positive ions.

Figure 8A:
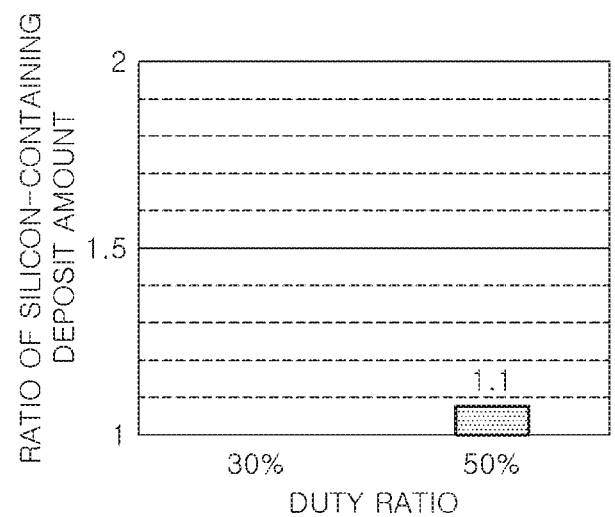
FIGS. 8A and 8B are graphs showing a ratio of a silicon-containing deposit amount obtained in a second test.
Figure 8B:
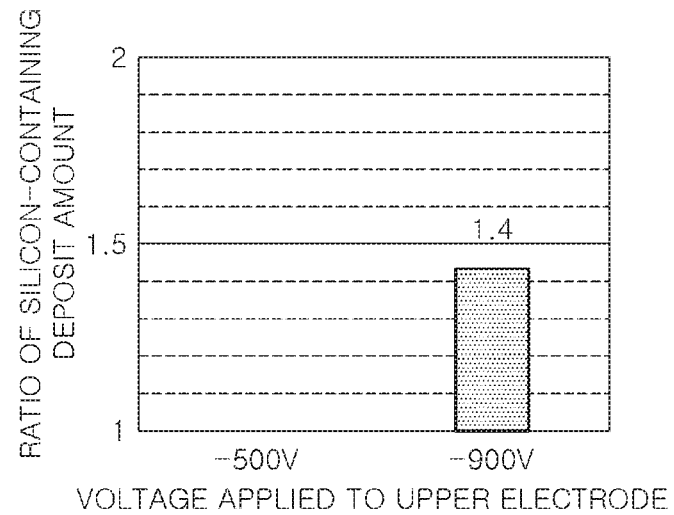

FIGS. 8A and 8B are graphs showing the ratio of the silicon-containing deposit amount obtained in the second test. In FIG. 8A, the horizontal axis represents the duty ratio of the pulsed negative DC voltage. In FIG. 8B, the horizontal axis represents the voltage level (pulsed negative DC voltage) applied to the upper electrode. In FIGS. 8A and 8B, the vertical axis represents the ratio of the silicon-containing deposit amount. The ratio of the silicon-containing deposit amount in FIG. 8A is normalized by the amount of silicon-containing deposits at the duty ratio of 30%. The ratio of the silicon-containing deposit amount in FIG. 8B is normalized by the amount of the silicon-containing deposits at the pulsed negative DC voltage of −500V.

According to the second test, as shown in FIG. 8A, the amount of the silicon-containing deposits adhered on the sample on the electrostatic chuck 20 has little dependency on the duty ratio. On the other hand, as shown in FIG. 8B, the amount of the silicon-containing deposits adhered on the sample on the electrostatic chuck 20 was increased as the absolute value of the pulsed negative DC voltage was increased. Accordingly, it is clear that by setting the first duty ratio in step ST1 to a small value, the bias generated on the inner wall surface in 10 of the chamber can be reduced while suppressing the influence on the plasma processing for the substrate W. In addition, it is clear that the plasma processing for the substrate W can be controlled by setting the first duty ratio to a small value and adjusting the level of the pulsed negative DC voltage in step ST1.

The embodiments of the present disclosure are illustrative in all respects and are not restrictive. The above-described embodiments can be embodied in various forms. Further, the above-described embodiments may be omitted, remounted, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. An apparatus for plasma processing, comprising:
a chamber;
a substrate support including a lower electrode disposed in the chamber;
an upper electrode disposed above the substrate support;
an RF power supply configured to generate plasma in the chamber;
a DC power supply electrically connected to the upper electrode; and
a controller configured to control the RF power supply and the DC power supply,
wherein the chamber is grounded,
the DC power supply is configured to periodically generate a pulsed negative DC voltage,
an output voltage of the DC power supply is a negative DC voltage in a first period of a cycle and is 0V in a remaining second period of the cycle to periodically output the pulsed negative DC voltage, and
the controller is configured to
perform a first control in which the RF power supply supplies an RF power and the DC power supply periodically applies the pulsed negative DC voltage to the upper electrode to perform the plasma processing on a substrate mounted on the substrate support,
perform a second control in which the RF power supply supplies an RF power and the DC power supply periodically applies the pulsed negative DC voltage to the upper electrode to perform plasma cleaning on an inner wall surface of the chamber,
set a first duty ratio used for the first control to be smaller than a second duty ratio used for the second control, wherein each of the first duty ratio and the second duty ratio is a ratio of the first period to the cycle, and
set an absolute value of an average value of the output voltage of the DC power supply in the cycle in the first control to be smaller than an absolute value of an average value of the output voltage of the DC power supply in the cycle in the second control.

2. The apparatus of claim 1, wherein a frequency that is a reciprocal of the cycle is 400 kHz or more.

3. The apparatus of claim 2, wherein the frequency is 1 MHz or less.

4. The apparatus of claim 3, wherein each of the first duty ratio and the second duty ratio is 20% or more and 50% or less.

5. The apparatus of claim 2, wherein each of the first duty ratio and the second duty ratio is 20% or more and 50% or less.

6. The apparatus of claim 1, wherein each of the first duty ratio and the second duty ratio is 20% or more and 50% or less.

7. A method of plasma processing performed by a plasma processing apparatus including a chamber, a substrate support including a lower electrode disposed in the chamber, an upper electrode disposed above the substrate support, an RF power supply configured to generate plasma in the chamber, and a DC power supply electrically connected to the upper electrode wherein the chamber is grounded, the DC power supply is configured to periodically generate a pulsed negative DC voltage, and an output voltage of the DC power supply is a negative DC voltage in a first period of a cycle and is 0V in a remaining second period of the cycle to periodically output the pulsed negative DC voltage, the method comprising:
performing the plasma processing on a substrate mounted on the substrate support; and
performing plasma cleaning on an inner wall surface of the chamber,
wherein in said performing the plasma processing, the RF power supply supplies an RF power and the DC power supply periodically applies the pulsed negative DC voltage to the upper electrode, and
in said performing the plasma cleaning, the RF power supply supplies an RF power and the DC power supply periodically applies the pulsed negative DC voltage to the upper electrode,
wherein a first duty ratio used in said performing the plasma processing is smaller than a second duty ratio used in said performing the plasma cleaning, each of the first duty ratio and the second duty ratio being a ratio of the first period to the cycle, and
an absolute value of an average value of the output voltage of the DC power supply in the cycle in said performing the plasma processing is smaller than an absolute value of an average value of the output voltage of the DC power supply in the cycle in said performing the plasma cleaning.

8. The method of claim 7, wherein a frequency that is a reciprocal of the cycle is 400 kHz or more.

9. The method of claim 8, wherein the frequency is 1 MHz or less.

10. The method of claim 9, wherein each of the first duty ratio and the second duty ratio is 20% or more and 50% or less.

11. The method of claim 8, wherein each of the first duty ratio and the second duty ratio is 20% or more and 50% or less.

12. The method of claim 7, wherein each of the first duty ratio and the second duty ratio is 20% or more and 50% or less.

* * * * *